(12) United States Patent
Cho et al.

(10) Patent No.: US 11,984,884 B2
(45) Date of Patent: May 14, 2024

(54) POWER SUPPLY DEVICE, AND METHOD FOR CONTROLLING SAME

(71) Applicant: Samsung Electronics Co., Ltd., Suwon-si (KR)

(72) Inventors: Jehyung Cho, Suwon-si (KR); Teaho Lee, Suwon-si (KR); Daesung Kang, Suwon-si (KR); Dongjo Shin, Suwon-si (KR); Cheolhun Cho, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 18/155,439

(22) Filed: Jan. 17, 2023

(65) Prior Publication Data

US 2023/0155585 A1 May 18, 2023

Related U.S. Application Data

(63) Continuation of application No. PCT/KR2021/011674, filed on Aug. 31, 2021.

(30) Foreign Application Priority Data

Oct. 15, 2020 (KR) .................. 10-2020-0133770

(51) Int. Cl.
*H03K 17/18* (2006.01)
*G01R 19/155* (2006.01)
(Continued)

(52) U.S. Cl.
CPC ........... *H03K 17/18* (2013.01); *G01R 19/155* (2013.01); *H02M 1/0003* (2021.05); *H02J 9/005* (2013.01)

(58) Field of Classification Search
None
See application file for complete search history.

(56) References Cited

U.S. PATENT DOCUMENTS 9,366,717 B2  6/2016 Ratz
10,048,305 B2  8/2018 Iwasaki
(Continued)

FOREIGN PATENT DOCUMENTS

JP  09-238461 A  9/1997
JP  2010-122082 A  6/2010
(Continued)

OTHER PUBLICATIONS

International Search Report dated Dec. 22, 2021, issued in International Patent Application No. PCT/KR2021/011674.
(Continued)

*Primary Examiner* — Jeffrey S Zweizig
(74) *Attorney, Agent, or Firm* — Jefferson IP Law, LLP

(57) ABSTRACT

A power supply device is provided. The power supply device includes a first switch element for selectively providing an alternating current (AC) power source to an actuation device, a second switch element for selectively providing the AC power source to the first switch element, a detection circuit for confirming whether or not the first switch element is in a full turn-on state, by comparing an input power source and an output power source of the first switch element, a sensor for sensing the size of the AC power source, and a controller for selectively controlling the operation of the second switch element on the basis of the sensed size of the AC power source and the confirmed full turn-on state.

15 Claims, 9 Drawing Sheets

(51) Int. Cl.
*H02M 1/00* (2006.01)
*H02J 9/00* (2006.01)

(56) References Cited

U.S. PATENT DOCUMENTS

| | | |
|---|---|---|
| 10,536,991 B2 | 1/2020 | Novikov et al. |
| 11,334,018 B2 | 5/2022 | Jeong et al. |
| 2015/0162747 A1 | 6/2015 | Iwasaki |
| 2015/0168484 A1 | 6/2015 | Ratz |
| 2016/0094146 A1 | 3/2016 | Paul et al. |
| 2021/0255574 A1 | 8/2021 | Jeong et al. |
| 2023/0155476 A1* | 5/2023 | Cho ........................ H02M 7/72 363/37 |

FOREIGN PATENT DOCUMENTS

| | | |
|---|---|---|
| JP | 2013-072689 A | 4/2013 |
| JP | 2015-115963 A | 6/2015 |
| JP | 6353648 B2 | 7/2018 |
| JP | 2019-120717 A | 7/2019 |
| JP | 2019-193126 A | 10/2019 |
| KR | 10-1997-0029580 A | 6/1997 |
| KR | 10-0230769 B1 | 11/1999 |
| KR | 10-2006-0018042 A | 2/2006 |
| KR | 10-0827383 B1 | 5/2008 |
| KR | 10-2020-0029196 A | 3/2020 |

OTHER PUBLICATIONS

International Search Report dated Aug. 31, 2021, issued in International Patent Application No. PCT/KR2021/011674.

* cited by examiner

POWER SUPPLY DEVICE, AND METHOD FOR CONTROLLING SAME

CROSS-REFERENCE TO RELATED APPLICATION(S)

This application is a continuation application, claiming priority under § 365(c), of an International application No. PCT/KR2021/011674, filed on Aug. 31, 2021, which is based on and claims the benefit of a Korean patent application number 10-2020-0133770, filed on Oct. 15, 2020, in the Korean Intellectual Property Office, the disclosure of which is incorporated by reference herein in its entirety.

BACKGROUND

1. Field

The disclosure relates to a power supply device and a method for controlling the same. More particularly, the disclosure relates to a power supply device that may selectively confirm whether there is an abnormality in a switch element according to a power mode and operate, and a method for controlling the same.

2. Description of the Related Art

A power supply device is a device that is provided with an alternating current (AC) power source from the outside, and convers the provided AC power source into a power source appropriate for each component inside an electronic device, and provides the power source to each component inside.

In case a power device includes a component that operates by directly receiving an AC power source, the power supply device performs control through phase control, on/off control, or speed control, and the like, for the component by using a switch element such as a triac, a solid state relay (SSR), etc.

However, in case the aforementioned switch element breaks down, overheat generation or overspeed may be generated. Accordingly, there is a demand for a technology that may confirm whether there is an abnormality in the aforementioned switch element and may prevent supply of an AC power source to the switch element.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide a power supply device that may selectively confirm whether there is an abnormality in a switch element according to a power mode and operate, and a method for controlling the same.

Additional aspects will be set forth in part in the description which follows and, in part, will be apparent from the description, or may be learned by practice of the presented embodiments.

In accordance with an aspect of the disclosure, a power supply device is provided. The power supply device includes a first switch element that selectively provides an AC power source to an actuation device, a second switch element that selectively provides the AC power source to the first switch element, a detection circuit that confirms whether the first switch element is in a full turn-on state by comparing an input power source and an output power source of the first switch element, a sensor that senses the size of the AC power source, and a controller configured to selectively control the operation of the second switch element based on the sensed size of the AC power source and the confirmed full turn-on state.

In this case, the controller may confirm the power mode of the AC power source based on the sensed size of the AC power source, and control the operation of the second switch element based on the confirmed power mode and the confirmed full turn-on state of the first switch element.

In this case, the controller may, based on the confirmed power mode being a low voltage mode, control the second switch element so that the second switch element maintains an on state, and based on the confirmed power mode being a high voltage mode and the confirmed first switch element being in a full turn-on state, control the second switch element so that the second switch element is turned off.

Meanwhile, the detection circuit may include a comparison circuit that compares the input power source of the first switch element and the output power source of the first switch element, and a conversion circuit that outputs a voltage value corresponding to a frequency component of an output signal of the comparison circuit.

In this case, the comparison circuit may, based on the first switch element performing a switching operation, output a toggle signal wherein a high value and a low value are alternatingly converted, and based on the first switch element maintaining an on state or an off state, output a direct current (DC) signal maintaining a constant value.

In this case, the conversion circuit may, based on the toggle signal being input, output a voltage value of a size that may turn on the second switch element, and based on the DC signal being input, output a voltage value of a size that may turn off the second switch element.

Meanwhile, the comparison circuit may receive input of an offset voltage, and apply the input offset voltage to the input power source of the first switch element or the output power source of the first switch element, and compare the input power source and the output power source of the first switch element.

Meanwhile, the power supply device according to the disclosure further includes a first logic circuit that receives input of a first output signal corresponding to whether the first switch element is in a full turn-on state and a second output signal corresponding to the power mode, and outputs a logical sum of the first output signal and the second output signal.

In this case, the power supply device according to the disclosure further includes a second logic circuit that receives input of a third output signal of the first logic circuit and an operation signal for the second switch element output from the controller, and outputs a logical conjunction of the third output signal and the operation signal.

In this case, the second switch element may selectively provide the AC power source to the first switch element based on the output signal of the second logic circuit.

Meanwhile, the power supply device according to the disclosure further includes a zero cross detection circuit that detects a zero cross point of the AC power source, and the controller may, based on the detected zero cross point, control the first switch element so that the first switch element is turned on only within a predetermined phase of the AC power source.

In this case, the controller may, based on the AC power source being in a low voltage mode, and supply of an AC power source to the actuation device being necessary, control the first switch element so that the first switch element is turned on within a total phase range of the AC power source.

Meanwhile, the first switch element may be one of a triac, a thyristor, an insulated-gate bipolar transistor (IGBT), or a metal-oxide-semiconductor field-effect transistor (MOSFET), and the second switch element may be a relay.

Meanwhile, the power supply device according to the disclosure further includes a rectification circuit rectifying an input AC power source, a capacitor circuit including a first capacitor and a second capacitor serially connected, and smoothing the AC power source rectified in the rectification circuit, and a third switch element selectively connecting an intermediate node of the first capacitor and the second capacitor and one end of the AC power source, and the sensor may sense the size of an output power source of the capacitor circuit.

In this case, the controller may confirm the power mode of the AC power source based on the on/off state of the third switch element and an output value of the sensor.

In accordance with another aspect of the disclosure, a method for controlling a power supply device is provided. The method includes the steps of sensing the size of an AC power source input into the power supply device, confirming whether a first switch element selectively providing the AC power source to an actuation device is in a full turn-on state, and controlling the operation of the second switch element selectively providing the AC power source to the first switch element based on the sensed size of the AC power source and the confirmed full turn-on state of the first switch element.

In this case, in the controlling step, the power mode of the AC power source may be confirmed based on the sensed size of the AC power source, and the operation of the second switch element may be controlled based on the confirmed power mode and the confirmed full turn-on state of the first switch element.

In this case, in the controlling step, based on the confirmed power mode being a low voltage mode, the second switch element may be controlled so that the second switch element maintains an on state, and based on the confirmed power mode being a high voltage mode and the confirmed first switch element being in a full turn-on state, the second switch element may be controlled so that the second switch element is turned off.

Meanwhile, the controlling method according to the disclosure further includes the steps of detecting a zero cross point of the AC power source, and based on the detected zero cross point, controlling the first switch element so that the first switch element is turned on only within a predetermined phase of the AC power source.

In this case, in the step of controlling the first switch element, based on the AC power source being in a low voltage mode, and supply of an AC power source to the actuation device being necessary, the first switch element may be controlled so that the first switch element is turned on within a total phase range of the AC power source.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

The same reference numerals are used to represent the same elements throughout the drawings.

DETAILED DESCRIPTION

Figure 1:
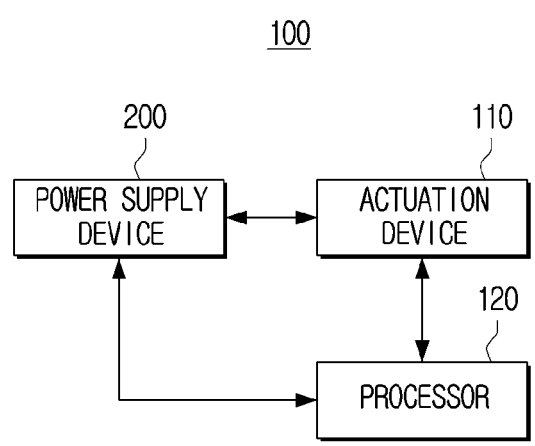
FIG. 1 is a block diagram illustrating a configuration of an electronic device according to an embodiment of the disclosure.

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding in the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Further, various modifications may be made to the embodiments of the disclosure, and there may be various types of embodiments. Accordingly, specific embodiments will be illustrated in drawings, and the embodiments will be described in detail in the detailed description. However, it should be noted that the various embodiments are not for limiting the scope of the disclosure to a specific embodiment, but they should be interpreted to include all modifications, equivalents, or alternatives of the embodiments included in the ideas and the technical scopes disclosed herein. Meanwhile, in case it is determined that in describing embodiments, detailed explanation of related known technologies may unnecessarily confuse the gist of the disclosure, the detailed explanation will be omitted.

Further, in the disclosure, terms such as "include" and "consist of" should be construed as designating that there are such characteristics, numbers, steps, operations, elements, components, or a combination thereof described in the specification, but not as excluding in advance the existence or possibility of adding one or more of other characteristics, numbers, steps, operations, elements, components, or a combination thereof.

Also, the expression "at least one of A and/or B" should be interpreted to mean any one of "A" or "B" or "A and B."

In addition, the expressions "first," "second," and the like used in this specification may be used to describe various elements regardless of any order and/or degree of importance. Also, such expressions are used only to distinguish one element from another element, and are not intended to limit the elements.

Further, the description in the disclosure that one element (e.g.: a first element) is "(operatively or communicatively) coupled with/to" or "connected to" another element (e.g.: a second element) should be interpreted to include both the case where the one element is directly coupled to the another element, and the case where the one element is coupled to the another element through still another element (e.g.: a third element).

Also, in the disclosure, "a module" or "a part" performs at least one function or operation, and may be implemented as hardware or software, or as a combination of hardware and software. Further, a plurality of "modules" or "parts" may be integrated into at least one module and implemented as at least one processor (not shown), except "modules" or "parts" which need to be implemented as specific hardware. In addition, in this specification, the term "user" may refer to a person who uses an electronic device or a device using an electronic device (e.g.: an artificial intelligence electronic device).

Hereinafter, embodiments of the disclosure will be described in detail with reference to the accompanying drawings to the extent that those having ordinary skill in the art to which the disclosure belongs may easily carry out the embodiments. However, the disclosure may be implemented in various different forms, and are not limited to the embodiments described herein. Also, in the drawings, parts that are not related to explanation were omitted, for explaining the disclosure clearly, and throughout the specification, similar components were designated by similar reference numerals.

Hereinafter, an embodiment of the disclosure will be described in more detail with reference to the accompanying drawings.

FIG. 1 is a block diagram illustrating a configuration of an electronic device according to an embodiment of the disclosure.

Referring to FIG. 1, an electronic device 100 may include a power supply device 200, an actuation device 110, and a processor 120. The electronic device may be a home appliance or a kitchen appliance such as a refrigerator, a washing machine, a dryer, a cleaner, an induction, an air conditioning device, and the like, having an actuation device like a motor, a heater, and the like, but is not limited thereto.

The power supply device 200 supplies power to each component inside the electronic device 100. Specifically, the power supply device 200 may receive input of an AC power source from the outside, convert the input AC power source into a power source of a predetermined size, and provide it to the internal components.

The power supply device 200 may confirm the power mode of the AC power source provided from the outside, and selectively perform voltage doubler amplification, etc. based on the confirmed power mode. The power mode may be divided into a high voltage mode wherein a high voltage AC power source (e.g., 220 V) is input and a low voltage mode wherein a low voltage AC power source of a relatively lower voltage (e.g., 127 V) is input according to the size of the AC power source provided from the outside.

Also, the power supply device 200 may bypass the AC power source input from the outside to an AC actuation device providing an AC power source. Specifically, the power supply device 200 may control a switch element and selectively provide the AC power source input from the outside to the AC actuation device. The power supply device 200 may confirm whether the switch element is in a full turn-on state by sensing the AC power source input into the switch element and the AC power source output from the switch element.

Explanation regarding the detailed components and operation of the power supply device 200 will be described later with reference to FIG. 2.

The actuation device 110 is a device that may perform a predetermined function of the electronic device 100. For example, in case the electronic device 100 is a refrigerator, the actuation device 110 is a motor operating a compressor, and may also be a heater operating with an AC.

The processor 120 may control each component inside the electronic device 100. Specifically, the processor 120 may be implemented as a central processing unit (CPU), an application specific integrated circuit (ASIC), a micro controller unit (MCU), and the like.

The processor 120 may control the actuation device 110 to perform a predetermined function. For example, in case the electronic device 100 is a refrigerator, the processor 120 performs phase control or heat quantity control, and the like, for the AC power source provided to the heater so that the heater for preventing frost inside the chambers of the refrigerator has a predetermined temperature.

Also, the processor 120 may confirm the power mode of the AC power source input into the power supply device 200, and control the power supply device 200 so that a voltage doubler amplifying operation is selectively performed according to the confirmed power mode. For example, in a case in which the input AC power source is in a high voltage mode (e.g., 220 V), the processor 120 controls the power supply device 200 so that a voltage doubler amplifying operation is not performed, and in a case in which the input AC power source is in a low voltage mode (e.g., 127 V or 110 V), the processor 120 controls the power supply device 200 so that a voltage doubler amplifying operation is performed.

In addition, the processor 120 may be provided with information on whether there is an abnormality in the switch element (specifically, full turn-on information) that selectively provides an AC power source to the AC actuation device inside the power supply device 200, and determine whether to provide the AC power source to the switch element based on the provided full turn-on information. The processor 120 may determine whether to provide the AC power source for the AC power source supply device based on the power mode identified previously. For example, in a case in which it is confirmed that the switch element is in a full turn-on state at the time of a high voltage mode, the processor 120 does not make the AC power source provided, and at the time of a low voltage mode, even in a case in which the switch element operates in a full turn-on state, the processor 120 makes the AC power source provided.

As described above, the electronic device 100 according to an embodiment of the disclosure may confirm whether there is an abnormality in the switch element providing an AC power source, and thus the electronic device 100 may secure stability. Also, the electronic device 100 according to an embodiment of the disclosure may confirm the power mode, and selectively activate or inactivate detection regarding an abnormality in the switch element according to the confirmed power mode, and thus the electronic device 100 may operate stably in various power mode environments.

Meanwhile, in illustrating and explaining FIG. 1, it was explained that the processor 120 confirms the mode of an AC power source and performs a control operation in accordance thereto, but in actual implementation, it is possible that the power supply device 200 figures out the mode of an AC power source by itself and operates.

Figure 2:
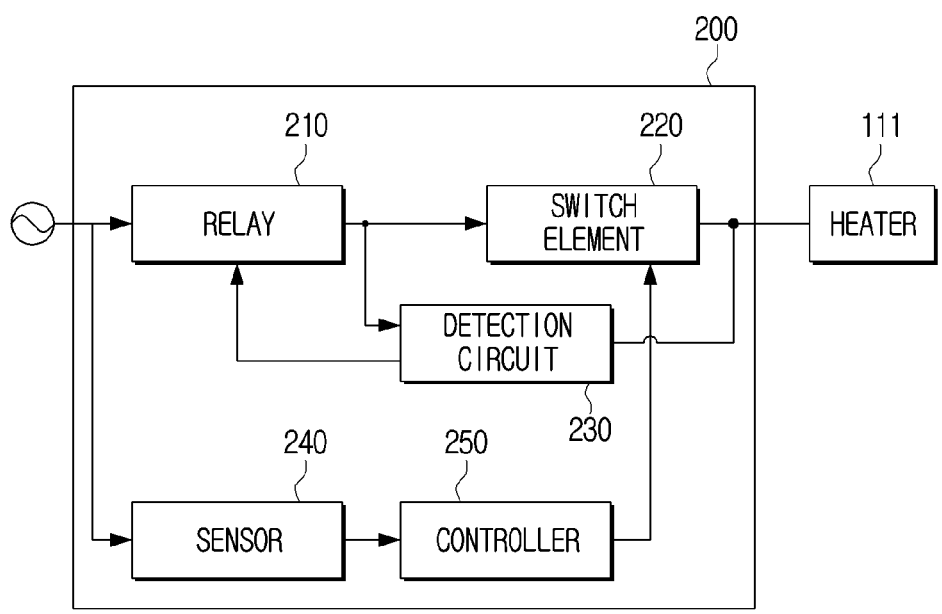
FIG. 2 is a block diagram illustrating a configuration of a power supply device according to an embodiment of the disclosure.

FIG. 2 is a block diagram illustrating a configuration of a power supply device according to an embodiment of the disclosure.

Referring to FIG. 2, the power supply device 200 may include a second switch element 210, a first switch element 220, a detection circuit 230, a sensor 240, and a controller 250.

The second switch element 210 may receive input of an AC power source from the outside, and selectively output the input AC power source. The AC power source input from the outside may be, for example, a high voltage AC power source of 220 V or a low voltage AC power source of 127 V or 110 V. Such a second switch element may consist of a relay, and it may be referred to as a relay for protection. Meanwhile, in the above, only a relay was described as an example of the second switch element, but various switch elements such as a triac, a thyristor, an insulated-gate bipolar transistor (IGBT), a MOSFET, and the like, other than a relay may be used, only in a case in which they may selectively perform on/off control of an AC power source according to an external control signal.

The first switch element 220 selectively provides an AC power source to the actuation device. Specifically, when the second switch element 210 is turned on, the first switch element 220 may be provided with an AC power source, and may selectively perform a switching operation according to an external control signal and provide the AC power source to the AC actuation device (e.g., the heater 111). Such a first switch element may be a triac, a thyristor, an IGBT, a MOSFET, and the like, but is not limited thereto.

The detection circuit 230 confirms whether the first switch element 220 is in a full turn-on state by comparing an input power source and an output power source of the first switch element 220. Explanation regarding the detailed components and operation of the detection circuit 230 will be described later with reference to FIG. 3.

The sensor 240 senses an AC power source. Specifically, the sensor 240 may sense the size of an AC power source, or sense a zero cross point of an AC power source. For this, the sensor 240 may include a sensor for sensing a size and a sensor for confirming a zero cross point.

The controller 250 controls each component inside the power supply device 200. The controller 250 may confirm the power mode of an AC power source based on an output signal of the sensor 240. For example, in case the power supply device 200 may operate in a low voltage mode such as 127 V and a high voltage mode such as 220 V, the controller 250 may confirm whether an input AC power source is in a low voltage mode or a high voltage mode based on an output value of the sensor 240.

Further, the controller 250 may confirm whether there is an abnormality in the first switch element. Specifically, in case the detection circuit 230 outputs a signal notifying that the first switch element is in a full turn-on state at the time of a high voltage mode, the controller 250 may confirm that there is an abnormality in the first switch element.

Then, the controller 250 may control the operation of the second switch element according to whether there is an abnormality in the first switch element. For example, in a case in which the first switch element is in a full turn-on state at the time of a high voltage mode, the controller 250 may turn off the second switch element so that the AC power source is not provided to the first switch element.

Meanwhile, in the above, it was explained that it is determined whether there is an abnormality in the first switch element, and the second switch element is controlled in accordance thereto, but in actual implementation, the second switch element may be controlled directly based on input values (e.g., the sensed size of the AC power source and a signal notifying that the first switch element is in a full turn-on state). That is, the controller 250 may selectively control the operation of the second switch element 210 based on the sensed size of the AC power source and the confirmed full turn-on state.

For example, in a case in which the confirmed power mode is a low voltage mode, the controller 250 controls the second switch element 210 so that the second switch element 210 maintains an on state, and in a case in which the confirmed power mode is a high voltage mode and the confirmed first switch element 220 is in a full turn-on state, the controller 250 controls the second switch element 210 so that the second switch element 210 is turned off.

Meanwhile, in actual implementation, even in the case of a low voltage mode, the second switch element 210 may be selectively on/off controlled so that the AC power source is provided to the first switch element 220 only on a time point when an operation of the AC actuation device is needed. That is, the controller 250 may control the second switch element 210 by considering not only the confirmed power mode and whether the first switch element is in a full turn-on state, but also the operation information of the AC actuation device, and the like.

As described above, the power supply device 200 according to an embodiment of the disclosure may confirm whether there is an abnormality in the switch element that selectively provides an AC to the AC power source device operating with an AC power source, and thus the power supply device 200 may secure stability. Also, the power supply device 200 according to an embodiment of the disclosure may confirm the power mode, and selectively activate or inactivate detection regarding an abnormality in the switch element according to the confirmed power mode, and thus the power supply device 200 may operate stably in various power mode environments.

Meanwhile, in illustrating and explaining FIG. 2, only components using an AC power source in the power supply device 200 were explained, but the power supply device 200 may further include components for converting an input AC power source into a DC power source, and the like, and a content in this regard will be described later with reference to FIG. 4.

Also, in illustrating and explaining FIG. 2, it was illustrated and explained that the controller 250 controls the operation of the second switch element 210 according to whether the first switch element is in a full turn-on state, but in actual implementation, the detection circuit 230 may directly confirm a full turn-on state, and in a case in which a full turn-on state is confirmed, control the second switch element 210. Such an implementation example will be described below with reference to FIG. 3.

Figure 3:
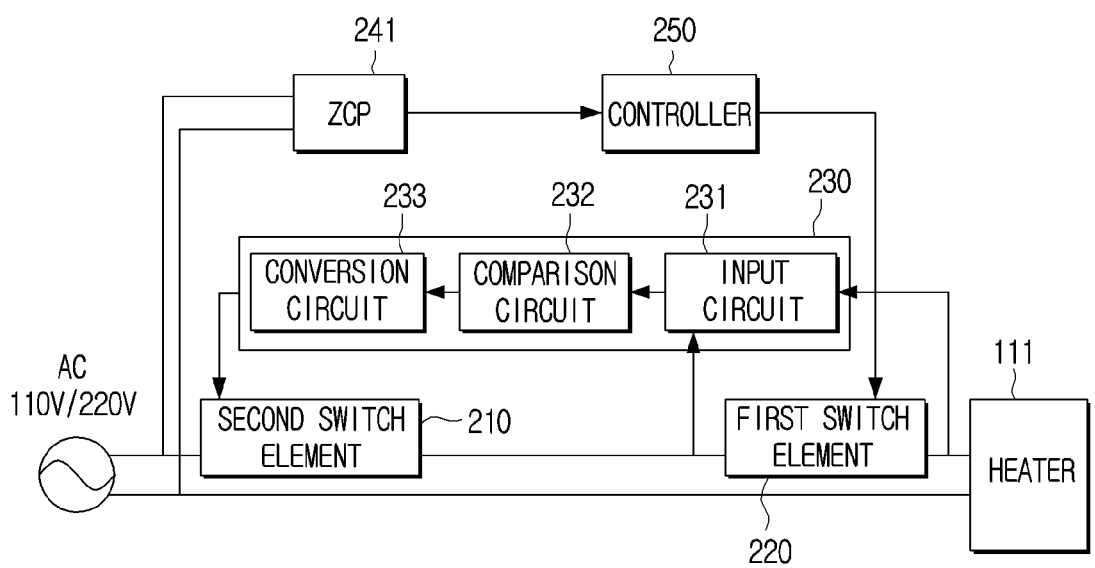
FIG. 3 is a circuit diagram of a power supply device according to an embodiment of the disclosure.

FIG. 3 is a circuit diagram of a power supply device according to an embodiment of the disclosure.

Referring to FIG. 3, the power supply device 200 may include a second switch element 210, a first switch element 220, a detection circuit 230, a zero cross detection circuit 241, and a controller 250.

The second switch element 210 may receive input of an AC power source from the outside, and may selectively bypass the AC power source to the side of the first switch element 220 according to control by the detection circuit 230.

The first switch element 220 may be provided with the AC power source from the second switch element 210, and may selectively provide the provided AC power source to the actuation device 110 (e.g., the heater 111) according to control by the controller 250.

The detection circuit 230 may confirm whether the first switch element 220 is in a full turn-on state, and in a case in which the first switch element 220 is in a full turn-on state, the detection circuit 230 may control the second switch element 210 so that the AC power source is not provided to the first switch element 220. Such a detection circuit 230 may include an input circuit 231, a comparison circuit 232, and a conversion circuit 233.

The input circuit 231 may be connected to each of an input end of the first switch element 220 and an output end of the first switch element 220, and may provide each of the input end and the output end to the comparison circuit 232.

The comparison circuit 232 compares the input power source of the first switch element and the output power source of the first switch element. Such a comparison circuit 232 may consist of a comparator, and in a case in which one power source from among two input power sources is bigger, the comparison circuit 232 may output a high value or a low value, and in a case in which the other power source is bigger on the contrary, the comparison circuit 232 may output a low value or a high value on the contrary.

According to such an operation, when the first switch element 220 performs a switching operation, the comparison circuit 232 may output a toggle signal wherein a high value and a low value are alternatingly converted. For example, in case the controller performs phase control for the AC power source, the first switch element 220 may output only a specific phase area for the AC power source, and in accordance thereto, the comparison circuit 232 may output a toggle signal wherein a high value and a low value are alternatingly converted by a predetermined time cycle. In contrast, in a case in which the first switch element 220 maintains an on state or an off state and maintains a constant value, the comparison circuit 232 may output a DC signal maintaining a constant value.

The comparison circuit 232 may receive input of an offset voltage, and apply the input offset voltage to the input power source of the first switch element or the output power source of the first switch element, and compare the input power source and the output power source of the first switch element. The offset voltage is a voltage that enables the comparison circuit 232 to generate a toggle signal even in a stand-by state, and the offset voltage may be changed according to a user's manipulation or control by the controller.

The conversion circuit 233 outputs a voltage value corresponding to a frequency component of an output signal of the comparison circuit. Specifically, the conversion circuit 233 is a circuit that may output an on signal in case a toggle signal is input, and it may consist of a frequency-voltage generation circuit. For example, in a case in which a toggle signal is input, the conversion circuit 233 may output a voltage value of a size that may turn on the second switch element (e.g., 5 V), and in a case in which a DC signal is input, the conversion circuit 233 may output a voltage value of a size that may turn off the second switch element (e.g., 0 V).

Then, the conversion circuit 233 may provide the output voltage value to the second switch element 210. Accordingly, in case the first switch element 220 outputs only a specific phase to the heater 111, the second switch element 210 may maintain a turn-on state, and in case the first switch element 220 is in a full turn-on state or in a state of not providing the AC power source, the second switch element 210 may have a turn-off state.

The zero cross detection circuit 241 detects a zero cross point of an AC power source. Specifically, for performing phase control for an AC power source, and the like, the zero cross point of the AC power source (e.g., the point of 0 V) should be known. The zero cross detection circuit is a circuit component for detecting a zero cross point of an AC power source.

The controller 250 controls the operation of the first switch element 220. Specifically, in a case in which actuation for the heater is needed, the controller 250 performs phase control, on/off control, or heat quantity control, and in the case of performing phase control, the controller 250 may control the operation of the first switch element 220 based on the zero cross point output from the zero cross detection circuit 241.

For example, in the case of performing phase control, the controller 250 controls the first switch element 220 so that the first switch element 220 is turned on only within a predetermined phase of the AC power source based on the detected zero cross point. Meanwhile, in the case of performing on/off control, the controller 250 may control the first switch element 220 so that the first switch element 220 is turned on or turned off according to a predetermined duty.

Meanwhile, in a case in which the AC power source is in a low voltage mode, and supply of the AC power source to the actuation device is needed, the controller 250 may control the first switch element so that the first switch element is turned on within the total phase range of the AC power source.

Meanwhile, in a case in which it is necessary to bypass the total phase of the AC power source in driving the heater 111 as the input power source is in a low voltage mode as above, and the first switch element 220 performs a full turn-on operation, the detection circuit 230 may detect a full turn-on state, and control the second switch element 210 to be turned off, as described above. Accordingly, in case the power mode is a low voltage mode, the aforementioned detection circuit 230 needs to be inactivated, and explanation about additional components and operations in this regard will be described later with reference to FIG. 4.

Meanwhile, in illustrating and explaining FIG. 3, it was explained that the detection circuit 230 detects a full turn-on state of the first switch element 220, and in a case in which a full turn-on state is detected, the detection circuit 230 directly controls the second switch element 210 and prevents supply of the AC power source to the first switch element 220. However, in actual implementation, control for the second switch element 210 may be ultimately performed by the controller 250, or performed through a combination with other information through a separate hardware component. Explanation in this regard will be described later with reference to FIG. 4.

Figure 4:
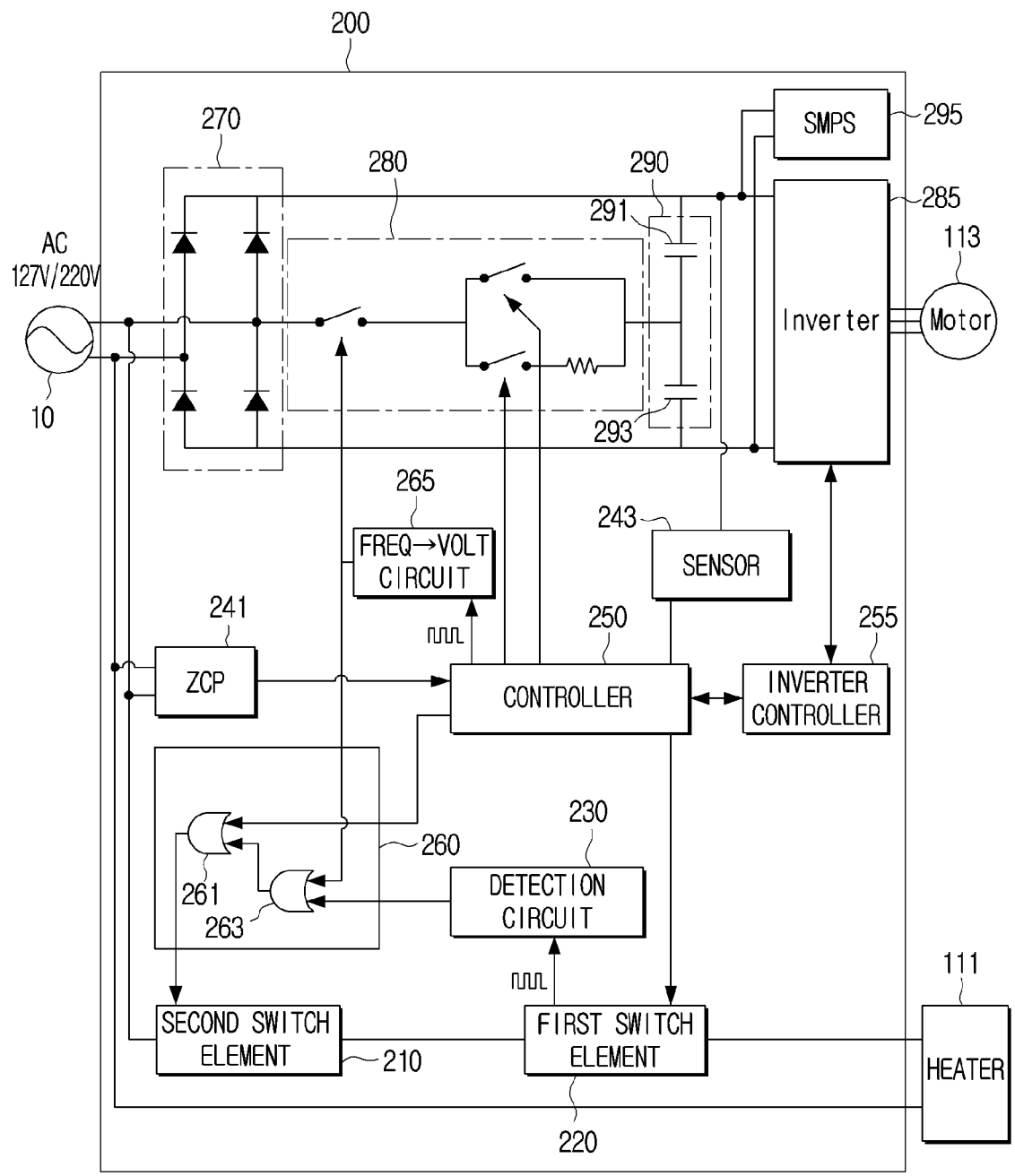
FIG. 4 is a circuit diagram of a power supply device according to an embodiment of the disclosure.

FIG. 4 is a circuit diagram of a power supply device according to an embodiment of the disclosure.

Referring to FIG. 4, the power supply device 200 may include a second switch element 210, a first switch element 220, a detection circuit 230, a sensor 240, a controller 250, an inverter controller 255, a logic circuit 260, a rectification circuit 270, a switch circuit 280, an inverter 285, a capacitor circuit 290, and an SMPS 295.

The rectification circuit 270 rectifies an input AC power source 10. For example, the rectification circuit 270 may consist of a full bridge circuit, wherein four diodes are connected in the form of a bridge, and an external AC power source may be input from two neutral points of the full bridge circuit. The input AC power source 10 may be a high voltage AC power source (a power source of a high voltage mode, e.g., 220 V) or a low voltage AC power source (a power source of a low voltage mode, e.g., 127 V).

The capacitor circuit 290 smooths the AC power source rectified in the rectification circuit 270. For example, the capacitor circuit 290 includes a first capacitor 291 and a second capacitor 293 serially connected. Then, in a case in which the switch circuit 280 that will be described below is in an on state, the capacitor circuit 290 may perform a voltage doubler amplifying operation.

The switch circuit 280 may selectively connect an intermediate node of the first capacitor 291 and the second capacitor 293 and one end of the AC power source. For example, the switch circuit 280 may be implemented as a mechanical switch such as a really, or a semiconductor switch such as a triac, and one end of it may be connected to the neutral point of the capacitor circuit 290 (i.e., the intermediate node of the first capacitor and the second capacitor), and the other end of it may be connected to the intermediate point of the rectification circuit 270 (i.e., one end of the input end into which the AC power source is input).

Such a switch circuit 280 may have a turn-off state (i.e., an open state) while a control signal is not input. Then, in a case in which a control signal is input and the switch circuit 280 gets in a turn-on state, the switch circuit 280 may consume power for maintaining the turn-on state. In contrast, in the turn-off state, the switch circuit 280 may not consume power.

Meanwhile, in the illustrated example, the switch circuit 280 was constituted by using three switches, but in actual implementation, the switch circuit 280 may be constituted with one switch or two switches.

The inverter 285 may convert an output power source of the capacitor circuit 290 into a power source of a predetermined size, and outputs the power source. Specifically, the inverter 285 is a component generating a power source necessary for actuation of the actuation device 110. In case the actuation device 110 is a motor actuated with a three-phase power source, the inverter 285 may convert the output power source of the capacitor circuit 290 into a three-phase power source, and provide the power source to the motor.

The switched mode power supply (SMPS) 295 may receive input of the output power source of the capacitor circuit 290, and convert the power source into a DC power source of a predetermined size. Then, the SMPS 295 may provide the DC power source to the controller 250, the inverter controller 255, and the like.

The second switch element 210 may selectively provide an AC power source to the first switch element 220. For example, the second switch element 210 may selectively provide an external AC power source to the first switch element 220 based on a signal output from the logic circuit 260.

The first switch element 220 may selectively provide the AC power source provided from the second switch element 210 to the actuation device 110 (e.g., the heater 111). For example, the first switch element 220 performs a selective switching operation according to a control command of the controller 250, and provide the provided AC power source to the heater 111.

The detection circuit 230 may confirm the voltages on both ends of the first switch element 220, and confirm a full turn-on state of the first switch element 220. For example, in a case in which the first switch element 220 is in a full turn-on state, the detection circuit 230 outputs a high value of a predetermined size (e.g., 1 V), and in a case in which the first switch element 220 is not in a full turn-on state, the detection circuit 230 outputs a low value of a predetermined size (e.g., 0 V). As the detailed components and operations of the detection circuit 230 were described earlier with reference to FIG. 3, detailed explanation will be omitted.

The sensor 240 may sense an AC power source, and output information on the size of the AC power source and a zero cross point. Such a sensor 240 may consist of the sensor 243 outputting the size of an AC power source and the zero cross detection circuit 241 outputting a zero cross point, as illustrated in FIG. 4. As the operation of the zero cross detection circuit 241 was explained with reference to FIG. 3, overlapping explanation will be omitted.

The sensor 243 senses the size of an output power source of the capacitor circuit 290. For example, the sensor 243 may be an IC device that senses the size of an output power source of the capacitor circuit 290 and provides the sensed size information to the controller 250 as a digital value. Alternatively, in case an ADC is provided in the controller 250, the sensor 243 may be implemented as a circuit of a resistance and an optical transceiver, and the like, or a circuit of a resistance and a transformer, and the like.

Meanwhile, in the disclosure, it was explained that the sensor 243 senses the size of an output power source of the capacitor circuit 290 and thereby confirms the size of an AC power source, but in actual implementation, the size of an AC power source may be sensed on the front end of the rectification circuit 270, and the size of an AC power source may also be confirmed by sensing a voltage inside the rectification circuit 270, or sensing a link voltage or a voltage of a link neutral end, and the like.

The inverter controller 255 controls the inverter 285 for controlling the actuation of the motor 113. Specifically, the inverter controller 255 may control the inverter 285 so that the motor 113 operates according to a predetermined algorithm, i.e., an actuation power source necessary for the actuation of the motor 113 is provided.

Then, the inverter controller 255 may provide information on the operation state of the inverter or the operation state of the actuation device (i.e., the motor) to the controller 250. The information on the operation state of the motor 113 may be information on the operation mode of the motor 113 (e.g., the mode indicating in which load state such as overload/general/low load/idle, etc. the motor 113 operates), information on the actuation speed of the motor 113, information on whether the motor follows the commanded speed, information on shortage of the actuation power source, etc.

The logic circuit 260 may receive input of a plurality of control signals, output a logic operation result for the input control signals, and provide the result to the second switch element 210. Specifically, the logic circuit 260 may receive input of an operation signal for the second switch element 210, and output a logic operation result only when an operation signal is input. Then, in case an operation signal is input, the logic circuit 260 may provide an output value of the second switch element 210 to the second switch element 210 according to an output signal of the detection circuit 230 only in a high voltage mode. For such an operation, the logic circuit 260 may include a first logic circuit 263 and a second logic circuit 261.

The first logic circuit 263 may operate a logical sum of two input signals, and output the sum. Specifically, the first logic circuit 263 may receive input of a first output signal corresponding to whether the first switch element is in a full turn-on state and a second output signal corresponding to the power mode, and output a logical sum of the first output signal and the second output signal.

The first output signal is an output signal of the detection circuit 230, and in a case in which the first switch element 220 is in a full turn-on state, the first output signal may have a low value (e.g., 0 V), and in a case in which the first switch element 220 is not in a full turn-on state, the first output signal may have a predetermined high value (e.g., 1 V).

Also, in a case in a high voltage AC power source (e.g., 220 V) is input as a signal value corresponding to the power mode, the second output signal may have a predetermined low value (e.g., 0 V), and in a case in a low voltage AC power source (e.g., 127 V or 110 V) is input, the second output signal may have a predetermined high value (e.g., 1 V).

The second logic circuit 261 may operate a logical conjunction for two input signals, and output the conjunction. Specifically, the second logic circuit 261 may receive input of a third output signal of the first logic circuit 263 and an operation signal for the second switch element 210 output from the controller 250, and output a logical conjunction of the third output signal and the operation signal.

Then, the second logic circuit 261 may provide an output signal as a control signal for the second switch element.

The second conversion circuit 265 outputs a voltage value corresponding to the power mode. Specifically, the second conversion circuit 265 is a circuit that may output an on signal in case a low voltage power source is input, and it may consist of a frequency-voltage generation circuit. For example, in a case in the second conversion circuit 265 receives a signal corresponding to a low voltage mode from the controller 250, the second conversion circuit 265 may output a voltage value of a size that the first logic circuit 263 may recognize as a high value, and in a case in a DC signal is input, the second conversion circuit 265 may output a voltage value of a size that the first logic circuit 263 may recognize as a low value. Meanwhile, in the illustrated example, it was explained that a signal corresponding to the voltage mode is output by using the second conversion circuit 265, but the controller 250 may directly output a signal to the switch circuit 280 and the first logic circuit 263 without using the separate second conversion circuit 265.

The controller 250 controls each component inside the power supply device 200. For example, the controller 250 may consist of a device such as an MCU, and the processor described above in FIG. 1 may also be used.

The controller 250 may confirm the power mode of an input power source. Specifically, the controller 250 may confirm the power mode of an AC power source based on an output value of the sensor 243. For example, in case the power supply device 200 may operate in a low voltage mode such as 127 V and a high voltage mode such as 220 V, the controller 250 may confirm whether an input AC power source is in a low voltage mode or a high voltage mode based on an output value of the sensor 243.

For example, when the switch circuit 280 is in an off state, in case the link voltage of the capacitor circuit 290 is approximately 155 V in a case in an AC power source of 127 V is input, and the link voltage of the capacitor circuit 290 is approximately 310 V in a case in an AC power source of 220 V is input, in a case in the link voltage corresponding to the output value of the sensor 243 is lower than 217 V, the controller 250 may confirm that the AC power source is in a low voltage mode, and in a case in the link voltage is higher than 217 V, the controller 250 may confirm that the AC power source is in a high voltage mode. However, the aforementioned numeral values are merely an example, and in actual implementation, values different from the aforementioned numerical values may be used.

Meanwhile, while the aforementioned switch circuit 280 is in an on state, the capacitor circuit 290 constitutes a voltage doubler circuit, and accordingly, even in case the power mode is a low voltage mode, i.e., in case an AC power source of 127 V is applied, the size of the voltage output from the capacitor circuit 290 (approximately 360 V) gets to have a similar size value to a case wherein an AC power source of 220 V is applied.

Because of this, the controller 250 may confirm the power mode based on not only an output value of the sensor 243, but also the operation state of the switch circuit 280. For example, while the switch circuit 280 is in an off state, the controller 250 may confirm the power mode by using only an output value of the sensor 243, and while the switch circuit 280 is in an on state, the controller 250 may confirm the power mode by using a value that corrected the output value of the sensor 243 (e.g., processing of multiplying the output value by ½ or processing of multiplying the output value by 1/sqrt(2)/2).

Then, the controller 250 may control the switch circuit 280 to constitute a voltage doubler amplification circuit based on the confirmed power mode. For example, in a case in which it is identified that the power mode is a low voltage mode, the controller 250 may control the switch circuit 280 so that the capacitor circuit 290 operates as a voltage doubler amplification circuit, i.e., so that the switch circuit 280 gets in an on state, and in a case in which it is identified that the power mode is a high voltage mode, the controller 250 may control the switch circuit 280 so that the capacitor circuit 290 does not operate as a voltage doubler amplification circuit, i.e., so that the switch circuit 280 has an off state.

Meanwhile, in the above, it was explained that the controller 250 confirms the voltage mode based on a sensed voltage value, and controls the switch circuit 280 according to the confirmed voltage mode, i.e., the controller 250 operates in two steps, but in actual implementation, the controller 250 may directly control the switch circuit 280 based on a sensed voltage value.

For example, while the switch circuit 280 is in an off state, in a case in which an output value of the sensor 243 is lower than a predetermined first value, the controller 250 controls the switch circuit 280 so that the switch circuit 280 is turned on, and while the switch circuit 280 is in an off state, in a case in which an output value of the sensor 243 is higher than the predetermined first value, the controller 250 controls the switch circuit 280 so that the switch circuit 280 maintains the off state. The first value may be a value (e.g., 217 V) between an output value at the time of a low voltage mode (e.g., 155 V) and an output value at the time of a high voltage mode (e.g., 310 V).

For example, while the switch circuit 280 is in an on state, in a case in which an output value of the sensor 243 is bigger than a predetermined second value, the controller 250 controls the switch circuit 280 so that the switch circuit 280 is turned off.

As described above, in the case of an environment wherein it is possible to operate in a low voltage mode and a high voltage mode, the AC actuation device (i.e., the heater 111) gets to operate in different performances. For example, in the case of a low voltage mode, there would be no burden on the AC actuation device even in a case in which the AC actuation device is controlled to be in a full turn-on state, but in the case of a high voltage mode, problems such as overload or overspeed may occur in a case in which the AC actuation device is controlled to be in a full turn-on state.

Accordingly, the controller 250 may vary control for the first switch element 220 according to the confirmed power mode. For example, in a case in which actuation for the heater 111 is needed, the controller 250 may perform phase control or heat quantity control in a high voltage mode, and control the operation of the first switch element 220 based on the zero cross point output from the zero cross detection circuit 241. Then, the controller 250 may perform phase control or heat quantity control in a low voltage mode, or control the operation of the first switch element 220 to be in a full turn-on state.

Further, the controller 250 may not make the second switch element 210 controlled according to a detection result of the detection circuit 230 in a low voltage mode. For example, in the case of operating in a low voltage mode, the controller 250 may provide a signal for the low voltage mode to the logic circuit 260, and make the second switch element 210 operate regardless of the detection result of the detection circuit 230.

Meanwhile, in the illustrated example, it was illustrated and explained that the aforementioned logic operation is performed by using the logic circuit 260, but in actual implementation, the aforementioned logic operation may be performed inside the controller 250.

As described above, the power supply device 200 according to an embodiment of the disclosure may confirm whether there is an abnormality in the switch element selectively providing an AC to the AC power device operating as an AC power source, and thus the power supply device 200 may secure stability. Also, the power supply device 200 according to an embodiment of the disclosure confirm the power mode, and selectively activate or inactivate detection regarding an abnormality in the switch element according to the confirmed power mode, and thus the power supply device 200 may operate stably in various power mode environments.

Further, the power supply device 200 according to an embodiment of the disclosure confirms the power mode, and selectively performs voltage doubler amplification according to the confirmed power mode, and thus there is no need for the user to separately perform switch manipulation according to the power mode, and breakage or damage by wrong manipulation may be prevented.

Meanwhile, in FIG. 4, it was illustrated that two controllers 250, 255 are included inside the power supply device 200, but in actual implementation, the two components may be implemented as one controller, and some functions of the two components may be implemented in forms of being performed in another device outside the power supply device 200 (e.g., the processor in FIG. 1).

Figure 5:
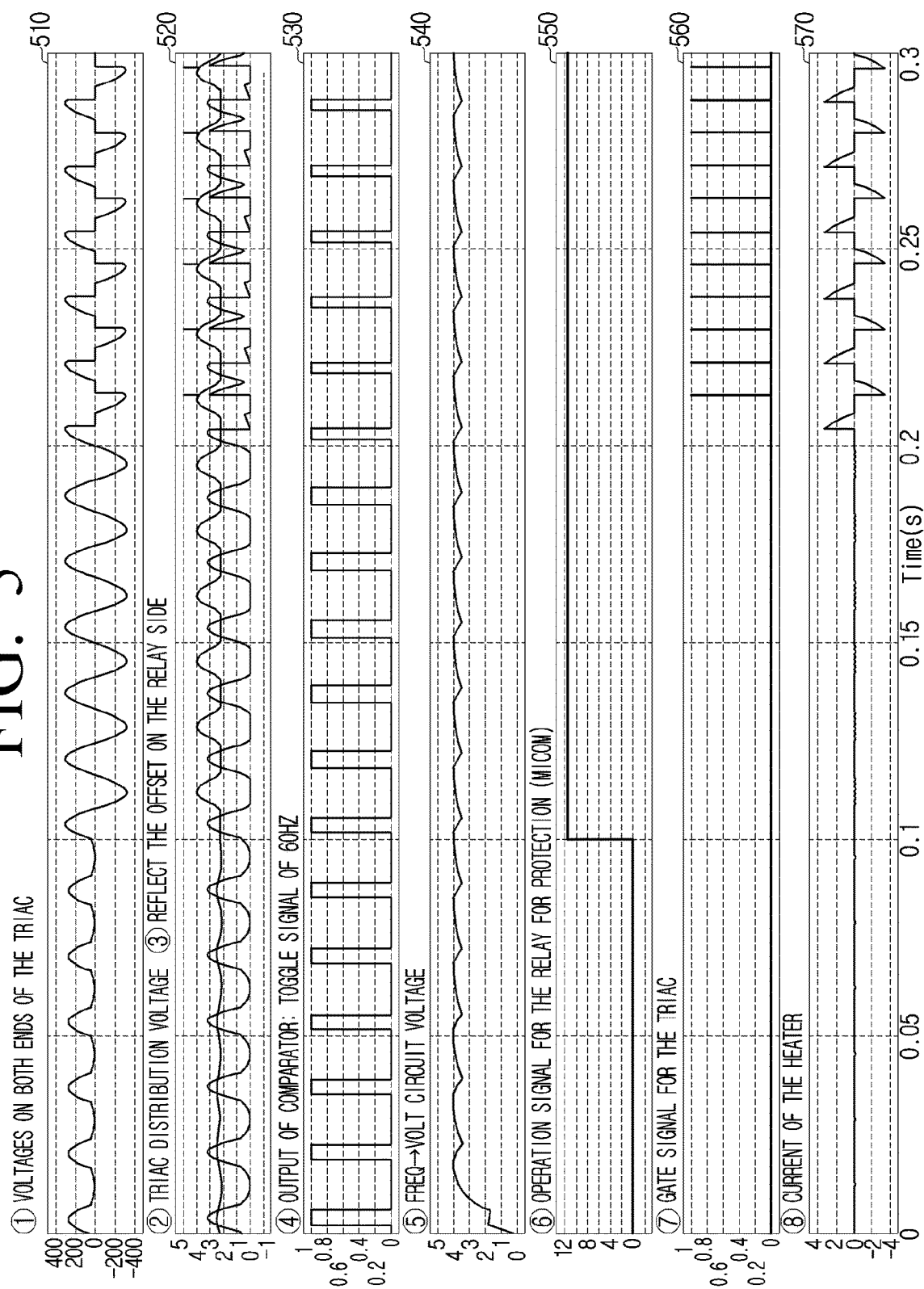
FIG. 5 is waveform diagrams of each component inside a power supply device in case a first switch element operates normally according to an embodiment of the disclosure.

FIG. 5 is waveform diagrams of each component inside the power supply device in case the first switch element operates normally according to an embodiment of the disclosure.

Referring to FIG. 5, simulation results for voltages 510 on both ends of the first switch element, a voltage distribution voltage for the voltages on both ends of the first switch element using a voltage distribution circuit and an offset voltage 520, an output voltage 530 of a comparison circuit, an output voltage 540 of a conversion circuit, an operation signal 550 for actuation of the second switch element (i.e., an input signal of the AND gate), a gate voltage 560 of the first switch element, and a current 570 of the heater are sequentially illustrated.

When an operation signal for the relay for protection starts to have a high value (0.1 ms), it may be confirmed that the voltages 510 on both ends of the first switch element get to have a similar waveform to an AC power source. Specifically, this is because of the fact that, although an AC power source is applied to the input end of the first switch element, the first switch element is in an off state, and thus there is no output power source.

In a state as above, in a case in which a gate signal for actuating the second switch element starts to be input into the second switch element, an actuation current gets to flow in the heater in accordance thereto, and in the comparator, a toggle signal according to turn-on/turn-off operations of the second switch element is generated.

Meanwhile, in the illustrated example, it may be confirmed that, as an offset signal that enables generation of a toggle signal in a stand-by state is provided to the comparison circuit, the comparison circuit continuously outputs a toggle signal. That is, this is because of the fact that an AC power source may be provided to the first switch element when the second switch element is in a turn-on state, and the second switch element is turned on when the comparison circuit outputs a toggle signal.

During such a normal operation, in case both ends of the first switch element 220 are short circuited due to the breakage of the first switch element 220, the actuation circuit, the controller 250, and the like, a toggle signal is not generated in the comparison circuit, and the second switch element 210 is turned off in accordance thereto, and may perform a protection function.

Meanwhile, hereinafter, operations according to breakage of some components inside the power supply device will be explained with reference to FIGS. 6 to 8.

Figure 6:
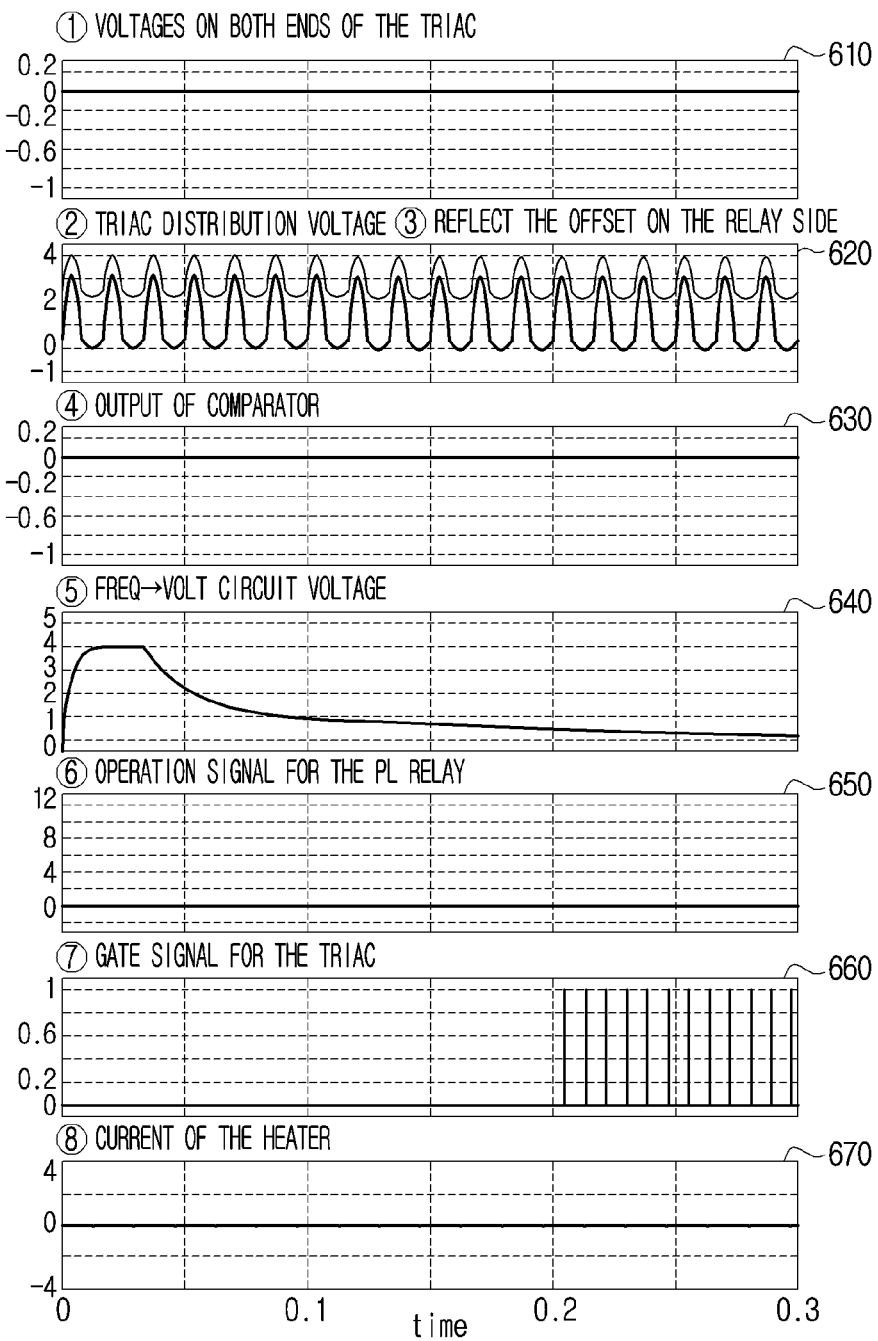
FIG. 6 is waveform diagrams of each component inside a power supply device in case a first switch element is short circuited according to an embodiment of the disclosure.

FIG. 6 is waveform diagrams of each component inside a power supply device in case a first switch element is short circuited according to an embodiment of the disclosure.

Referring to FIG. 6, in comparison to FIG. 5, as both ends of the first switch element 220 are short circuited, for the voltages on both ends of the first switch element 220, a constant voltage value is output in operation 610, and for a voltage distribution value in that regard, a constant voltage is also output in operation 620.

As there is no difference between the voltages on both ends of the first switch element 220, the comparator outputs a predetermined voltage (e.g., 0 V) in operation 630. Also, the conversion circuit outputs a predetermined voltage (e.g., 0 V).

Accordingly, for a signal controlling the second switch element, a signal maintaining the off state of the second switch element is also output in operation 650, and in case the controller outputs a gate signal for controlling the first switch element, it may be confirmed that an AC power source is not provided to the heater in operations 660 and 670.

Figure 7:
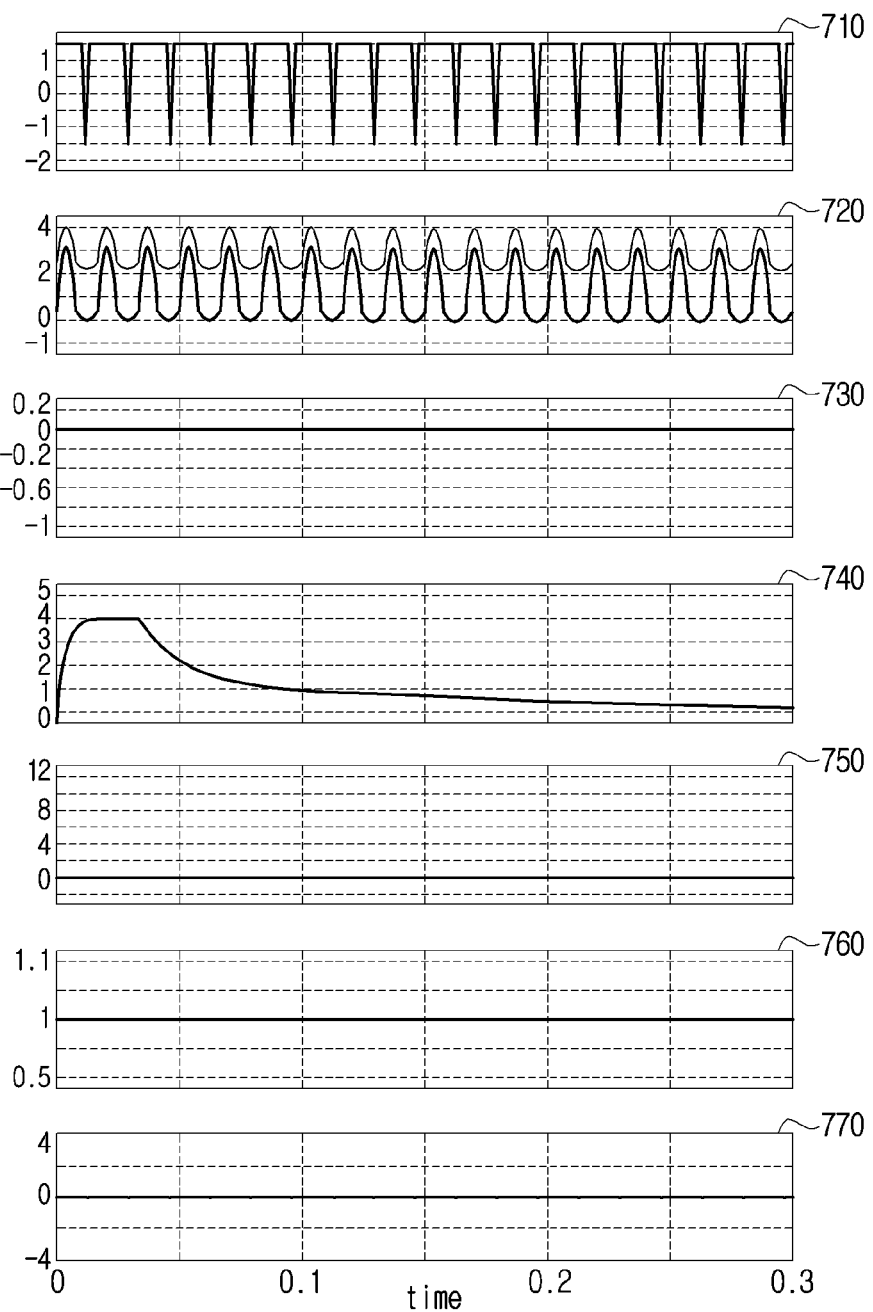
FIG. 7 is waveform diagrams of each component inside a power supply device in case both of a control signal for a first switch element and a control signal for the second switch element have a high value according to an embodiment of the disclosure.

FIG. 7 is waveform diagrams of each component inside a power supply device in case both of a control signal for a first switch element and a control signal for a second switch element have a high value according to an embodiment of the disclosure.

Referring to FIG. 7, it may be confirmed that a control signal provided to the first switch element 220 by the controller 250 is latched up, and a constant voltage is maintained in operation 760. In case the controller 250 outputs a signal making the first switch element 220 get in a full turn-on state as above, for the voltages on both ends of the first switch element 220, only a constant voltage value is output in operation 710, and for a voltage distribution value in that regard, a voltage wherein only a constant change is generated in the offset voltage is also output in operation 720.

As there is no difference between the voltages on both ends of the first switch element 220 and the offset voltage as above, the comparator outputs a predetermined voltage (e.g., 0 V) in operation 730. Also, the conversion circuit outputs a predetermined voltage (e.g., 0 V) in operation 740.

Accordingly, for a signal controlling the second switch element, a signal maintaining the off state of the second switch element is also output in operation 750, and in case an output signal of the controller is latched up and a constant voltage is output, it may be confirmed that an AC power source is not provided to the heater in operation 770.

Figure 8:
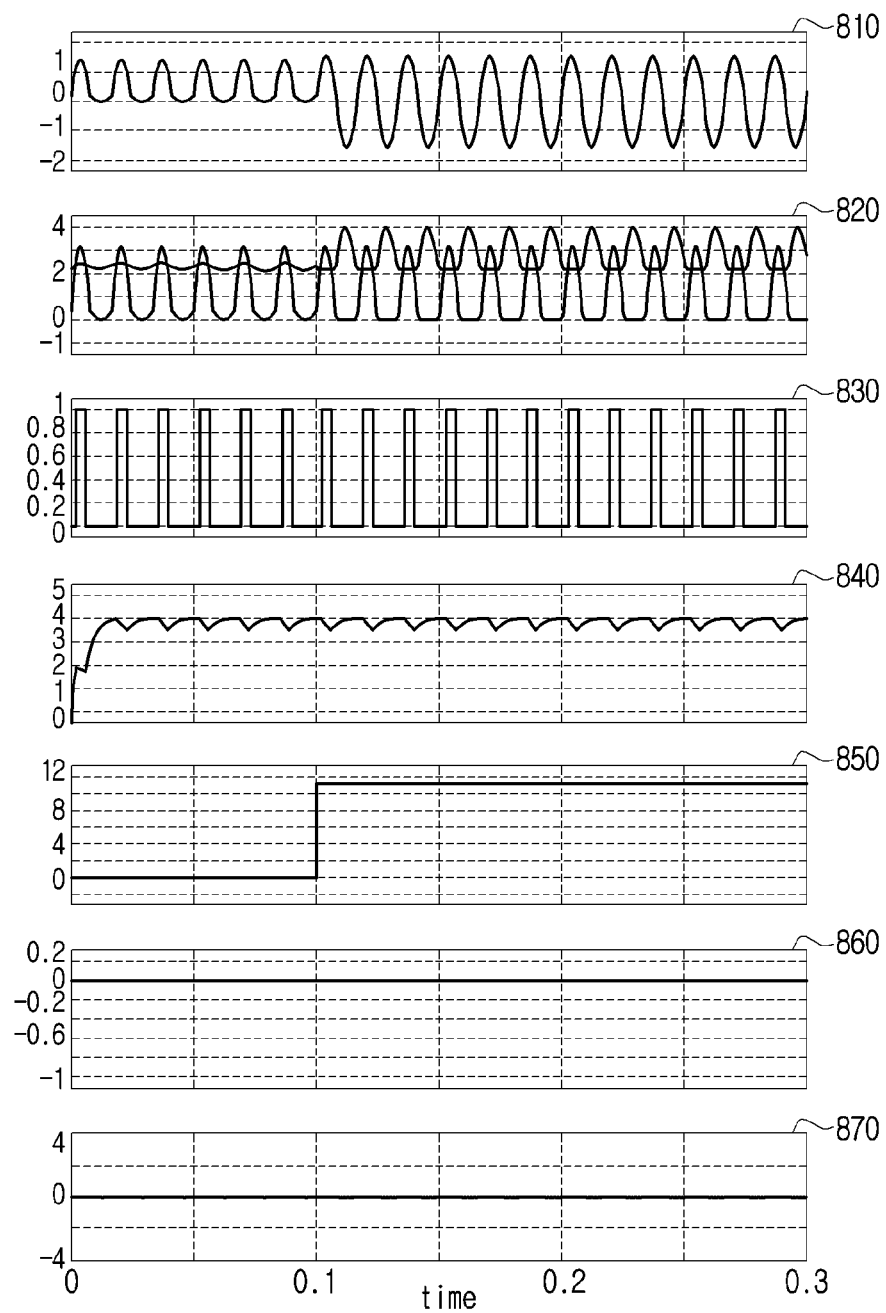
FIG. 8 is waveform diagrams of each component inside a power supply device in case both of a control signal for a first switch element and a control signal for a second switch element have a low value according to an embodiment of the disclosure.

FIG. 8 is waveform diagrams of each component inside the power supply device in case both of a control signal for the first switch element and a control signal for the second switch element have a low value according to an embodiment of the disclosure.

Referring to FIG. 8, it may be confirmed that a control signal provided to the first switch element 220 by the controller 250 is latched up, and a constant voltage (0 V) is maintained in operation 860. In case the controller 250 outputs a signal continuously turning off the first switch element 220 as above, for the voltages on both ends of the first switch element 220, a voltage value corresponding to the size of the AC power source is output in operation 810, and for a voltage distribution value in that regard, a voltage value corresponding to the waveform of the AC power source is also output in operation 820.

As described above, the voltage on one end (i.e., the input voltage) of the first switch element 220 has a waveform, but the voltage on the other end (i.e., the output voltage) of the first switch element 220 has a constant value, and thus the comparator gets to output a toggle signal by a predetermined period in operation 830.

Even in a case in which the comparator outputs a toggle signal, and the conversion circuit outputs a signal operating the second switch element as above in operation 850, the first switch element is latched up to 0 V in operation 860, and thus it may be confirmed that an AC power source is not provided to the heater in operation 870.

As illustrated and explained in FIGS. 6 to 8, it may be confirmed that in the power supply device according to an embodiment of the disclosure, a protection operation is performed normally in various error situations.

Figure 9:
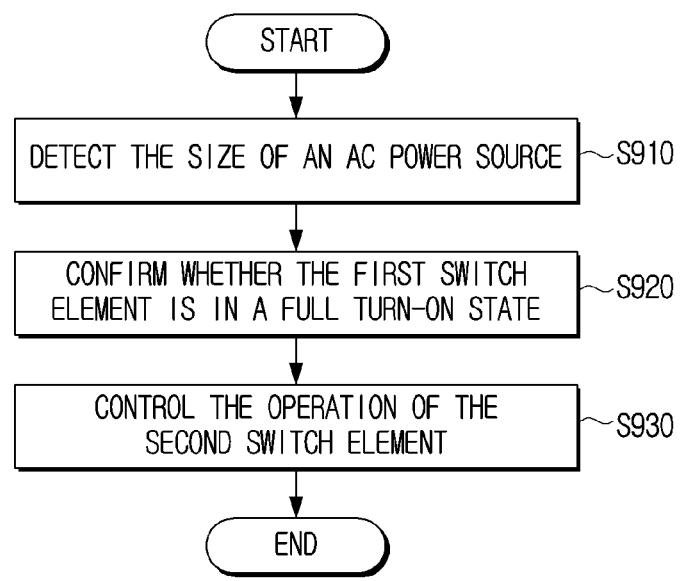
FIG. 9 is a flow chart for illustrating a method for controlling a power supply device according to an embodiment of the disclosure.

FIG. 9 is a flow chart for illustrating a method for controlling a power supply device according to an embodiment of the disclosure.

First, the size of an AC power source input into the power supply device is sensed in operation S910.

Then, it is confirmed whether a first switch element selectively providing the AC power source to an actuation device is in a full turn-on state in operation S920. Specifically, voltages on both ends of the first switch element may be confirmed, and the full turn-on state of the first switch element may be confirmed based on whether a difference value between the voltages on both ends periodically changes.

Then, the operation of the second switch element selectively providing the AC power source to the first switch element is controlled based on the sensed size of the AC power source and the confirmed full turn-on state of the first switch element in operation S930. Specifically, first, the power mode of the AC power source is confirmed based on the sensed size of the AC power source. For example, the power mode of the AC power source may be confirmed based on whether the capacitor circuit that may selectively operate as a voltage doubler amplification circuit performed voltage doubler amplification, and the sensed size of the AC power source.

Then, the operation of the second switch element is controlled based on the confirmed power mode and the confirmed full turn-on state of the first switch element. For example, in a case in which the confirmed power mode is a low voltage mode, the second switch element is controlled so that the second switch element maintains an on state, and in a case in which the confirmed power mode is a high voltage mode and the confirmed first switch element is in a full turn-on state, the second switch element is controlled so that the second switch element is turned off.

Also, in the controlling method, the first switch element may be controlled. Specifically, a zero cross point of the AC power source may be detected, and the first switch element may be controlled based on the detected zero cross point. For example, in a case in which the power mode is a high voltage mode, the first switch element may be controlled so that the first switch element is turned on only within a predetermined phase of the AC power source based on the detected zero cross point. Meanwhile, in a case in which the AC power source is in a low voltage mode, and supply of an AC power source to the actuation device is necessary, the first switch element may be controlled so that the first switch element is turned on within a total phase range of the AC power source.

Accordingly, the controlling method referring to FIG. 9, the power mode is confirmed, and voltage doubler amplification is selectively performed according to the confirmed power mode, and thus there is no need for the user to separately perform switch manipulation according to the power mode, and breakage or damage by wrong manipulation may be prevented. Also, in the controlling method according to an embodiment of the disclosure, even in the case of a low voltage mode wherein voltage doubler amplification is necessary, a voltage doubler amplifying operation is not performed when the load is not big, and thus power consumption generated in the internal components may be reduced. The controlling method as in FIG. 9 may be executed in an electronic device having the configuration as in FIG. 1, or a power supply device having the configurations in FIGS. 2 to 4, or may be executed in an electronic device or a power supply device having different configurations other than the above.

Also, the aforementioned controlling method may be executed as a program including an algorithm that is executable in a computer, and the aforementioned program may be provided while being stored in a non-transitory computer readable medium.

A non-transitory computer readable medium refers to a medium that stores data semi-permanently, and is readable by machines, but not a medium that stores data for a short moment such as a register, a cache, and a memory. Specifically, the aforementioned various applications or programs may be provided while being stored in a non-transitory computer readable medium such as a compact disc (CD), a digital video disc (DVD), a hard disk, a blue-ray disk, a universal series bus (USB), a memory card, a read-only memory (ROM) and the like.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. A power supply device comprising:
    a first switch element configured to selectively provide an alternating current (AC) power source to an actuation device;
    a second switch element configured to selectively provide the AC power source to the first switch element;
    a detection circuit configured to confirm whether the first switch element is in a full turn-on state by comparing an input power source and an output power source of the first switch element;
    a sensor configured to sense a size of the AC power source; and
    a controller configured to:
        selectively control operation of the second switch element based on the sensed size of the AC power source and the confirmed full turn-on state of the first switch element.

2. The power supply device of claim 1, wherein the controller is further configured to:
    confirm a power mode of the AC power source based on the sensed size of the AC power source, and
    control the operation of the second switch element based on the confirmed power mode and the confirmed full turn-on state of the first switch element.

3. The power supply device of claim 2, wherein the controller is further configured to:
    based on the confirmed power mode being a low voltage mode, control the second switch element so that the second switch element maintains an on state, and
    based on the confirmed power mode being a high voltage mode and the confirmed first switch element being in the full turn-on state, control the second switch element so that the second switch element is turned off.

4. The power supply device of claim 1, wherein the detection circuit comprises:
    a comparison circuit configured to compare the input power source of the first switch element and the output power source of the first switch element; and
    a conversion circuit configured to output a voltage value corresponding to a frequency component of an output signal of the comparison circuit.

5. The power supply device of claim 4, wherein the comparison circuit is further configured to:
    based on the first switch element performing a switching operation for an AC power source, output a toggle signal, wherein a high value and a low value are alternatingly converted, and
    based on the first switch element maintaining an on state or an off state, output a direct current (DC) signal maintaining a constant value.

6. The power supply device of claim 5, wherein the conversion circuit is further configured to:
    based on the toggle signal being input, output a voltage value of a size that is used to turn on the second switch element, and
    based on the DC signal being input, output a voltage value of a size that is used to turn off the second switch element.

7. The power supply device of claim 4, wherein the comparison circuit is further configured to:
    receive input of an offset voltage,
    apply the input offset voltage to the input power source of the first switch element or the output power source of the first switch element, and
    compare the input power source and the output power source of the first switch element.

8. The power supply device of claim 1, wherein the controller comprises:
    a first logic circuit, the first logic circuit being configured to:
        receive input of a first output signal corresponding to whether the first switch element is in the full turn-on state and a second output signal corresponding to a power mode, and
        output a logical sum of the first output signal and the second output signal.

9. The power supply device of claim 8, wherein the controller further comprises a second logic circuit configured to:
    receive input of a third output signal of the first logic circuit and an operation signal for the second switch element based on the sensed size of the AC power source, and
    output a logical conjunction of the third output signal and the operation signal.

10. The power supply device of claim 9, wherein the second switch element is further configured to selectively provide the AC power source to the first switch element based on an output signal of the second logic circuit.

11. The power supply device of claim 1, further comprising:
    a zero cross detection circuit configured to detect a zero cross point of the AC power source,
    wherein the controller is further configured to:
        based on the detected zero cross point, control the first switch element so that the first switch element is turned on only within a predetermined phase of the AC power source.

12. The power supply device of claim 11, wherein the controller is further configured to:
    based on the AC power source being in a low voltage mode, and supply of an AC power source to the actuation device being necessary, control the first switch element so that the first switch element is turned on within a total phase range of the AC power source.

13. The power supply device of claim 1,
    wherein the first switch element is one of a triac, a thyristor, an insulated-gate bipolar transistor (IGBT), or a metal-oxide-semiconductor field-effect transistor (MOSFET), and
    wherein the second switch element is a relay.

14. The power supply device of claim 1, further comprising:

a rectification circuit configured to rectify an input of the AC power source;

a capacitor circuit comprising a first capacitor and a second capacitor serially connected, the capacitor circuit configured to smooth the AC power source rectified in the rectification circuit; and a third switch element configured to selectively connect an intermediate node of the first capacitor and the second capacitor and one end of the AC power source, wherein the sensor is configured to sense the size of an output power source of the capacitor circuit.

15. A method for controlling a power supply device, the method comprising:

sensing a size of an alternating current (AC) power source input into the power supply device;

confirming whether a first switch element selectively providing the AC power source to an actuation device is in a full turn-on state; and controlling an operation of a second switch element selectively providing the AC power source to the first switch element based on the sensed size of the AC power source and the confirmed full turn-on state of the first switch element.

\* \* \* \* \*